United States Patent
Sawada et al.

(10) Patent No.: US 6,342,664 B2
(45) Date of Patent: Jan. 29, 2002

(54) DATA REPRODUCING APPARATUS

(75) Inventors: Takeshi Sawada, Tokyo; Toru Tanaka; Tadashi Sakai, both of Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/736,621

(22) Filed: Dec. 14, 2000

(30) Foreign Application Priority Data

Dec. 20, 1999 (JP) ............................................ 11-361613

(51) Int. Cl.$^7$ ................................................ G10H 7/00
(52) U.S. Cl. .............................. 84/601; 84/602; 84/600; 369/1
(58) Field of Search ............................ 84/600–603, 634, 84/645, 666, 477 R; 369/1–2, 6–12; 235/487, 492

(56) References Cited

U.S. PATENT DOCUMENTS

| | | | |
|---|---|---|---|
| 5,934,920 A | 8/1999 | Ito et al. ...................... 439/159 |
| 6,015,093 A | * 1/2000 | Barrett et al. ................. 235/492 |
| 6,042,009 A | * 3/2000 | Barrett et al. ................. 235/492 |
| 6,061,306 A | * 5/2000 | Buchheim ....................... 369/2 |
| 6,089,459 A | * 7/2000 | Eisele et al. ................. 235/492 |
| 6,167,251 A | * 12/2000 | Segal et al. .................. 455/406 |
| 6,192,340 B1 | * 2/2001 | Abecassis ..................... 704/270 |

FOREIGN PATENT DOCUMENTS

| EP | 1030310 | 8/2000 | ............ G11C/7/16 |
|---|---|---|---|
| EP | 1085516 | 3/2001 | ............ G11C/7/16 |
| JP | 7234925 | 9/1995 | ........... G06K/19/08 |

* cited by examiner

Primary Examiner—Marlon T. Fletcher
(74) Attorney, Agent, or Firm—Jay H. Maioli

(57) ABSTRACT

A music reproducing apparatus is provided by which audio data or the like can be downloaded into an internal memory with ease. A connector portion that can be connected to a predetermined card slot of a data processing apparatus, an audio data memory, an audio reproducing circuit and an audio data outputting section are integrally incorporated within a card-type housing of a music reproducing apparatus and hence the music reproducing apparatus can be easily connected to a data processing apparatus such as a personal computer apparatus.

10 Claims, 8 Drawing Sheets

DATA REPRODUCING APPARATUS

BACKGROUND OF THE INVENTION

1. Field of the Invention

The present invention relates to a portable data reproducing apparatus, and particularly relates to a music reproducing apparatus capable of downloading audio data when it is connected to a data processing apparatus such as a personal computer apparatus.

2. Description of the Related Art

Heretofore, a variety of portable music reproducing apparatus using a recording medium such as a tape cassette and a disk have been put into use. As a storage capacity of a semiconductor memory increases and audio data compression technologies are improved in recent years, there has been proposed a music reproducing apparatus using semiconductor memories as an audio data storage means.

The music reproducing apparatus using the semiconductor memory can be made smaller in size because the size of the storage medium can be made smaller as compared with a tape cassette and a disk. In the following description, the semiconductor memory will hereinafter be simply referred to as a memory.

The music reproducing apparatus using the memory as the audio data storage medium has to store audio data from the outside in the memory. Accordingly, the music reproducing apparatus is connected to a data processing apparatus such as a personal computer apparatus including a program to be able to process audio data, for example, and audio data from the personal computer apparatus has to be downloaded into the memory within the reproducing apparatus.

Therefore, some suitable means such as cables for joining the data processing apparatus and the reproducing apparatus are required and downloading itself takes a lot of time and labor.

SUMMARY OF THE INVENTION

In view of the aforesaid aspect, it is an object of the present invention to provide a music reproducing apparatus in which audio data can be downloaded with ease.

According to the present invention, a connector portion that can be connected to a predetermined card slot of a data processing apparatus, an audio data memory means, an audio reproducing circuit and an audio data outputting section are integrally incorporated within a card-type housing.

Accordingly, when the card-type housing is joined to the predetermined card slot of the data processing apparatus, it becomes possible to download audio data from the data processing apparatus. When a headphone apparatus is connected to the outputting section, a user becomes able to listen to reproduced sounds of audio data stored in the memory means.

DESCRIPTION OF THE PREFERRED EMBODIMENTS

A first embodiment according to the present invention will be described below with reference to FIGS. 1 to 3.

Figure 1:
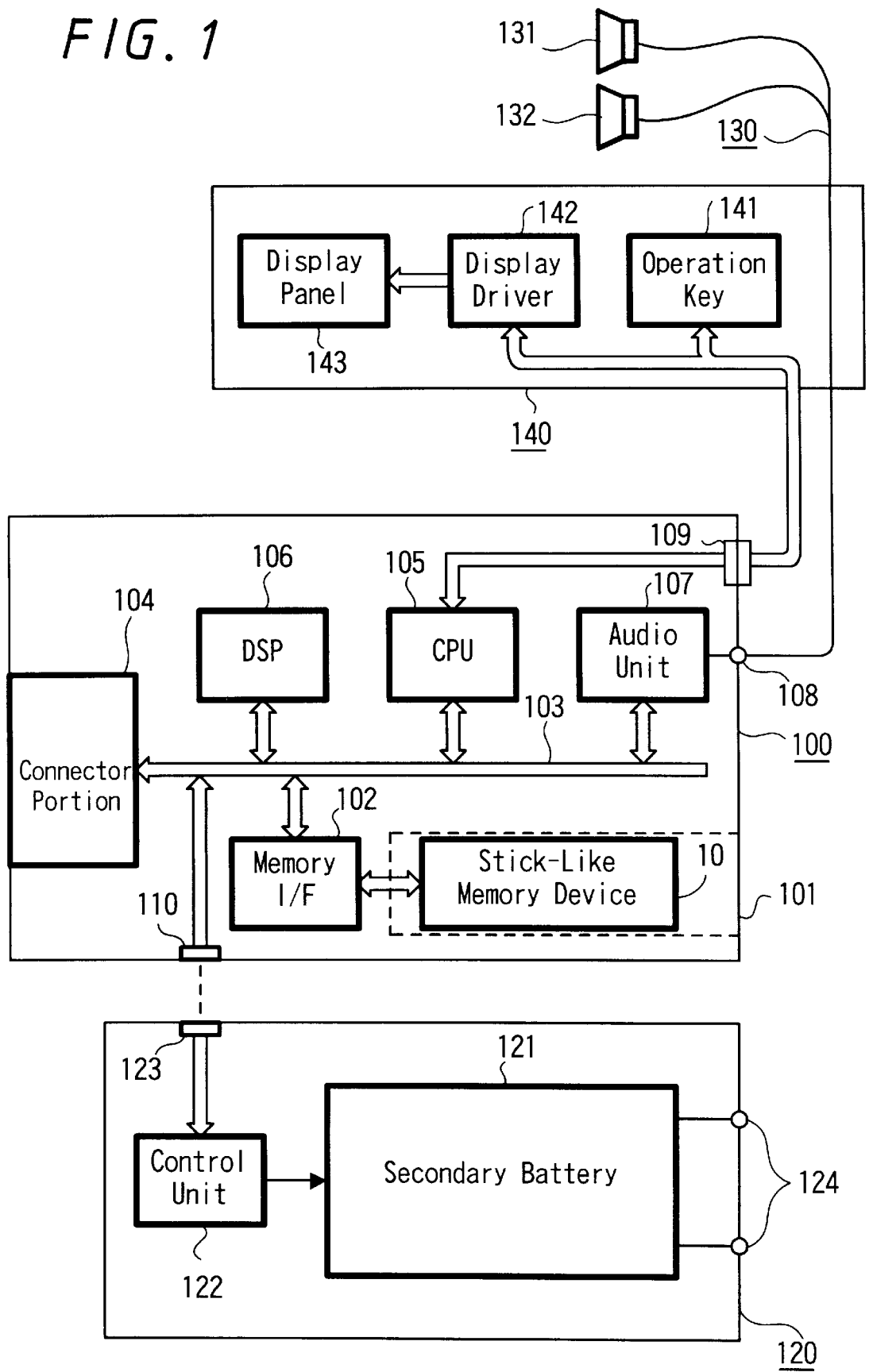
FIG. 1 is a block diagram showing an example of a system configuration according to a first embodiment of the present invention.

FIG. 1 is a block diagram showing an example of a system configuration of a music reproducing apparatus according to the embodiment of the present invention. The data reproducing apparatus according to this embodiment is an apparatus for reproducing music, and is configured as a card standardized by the PCMCIA (Personal Computer Memory Card International Association) standards for data processing apparatus such as personal computers and which can be inserted into the card slot. According to the PCMCIA standards, type I cards and type II cards are standardized based on the thickness of the card. This card has a thickness of type II, for example. Card slots into which PCMCIA standard cards can be inserted are very familiar to relatively small information terminals such as a notebook size computer apparatus.

The system configuration will be described below with reference to FIG. 1. A data reproducing apparatus body (this card-like music reproducing apparatus body will be below referred to as an audio reproducing card) 100 arranged as the PCMCIA standard card includes a memory attachment portion 101 to which a memory device 10 including a built-in semiconductor memory can be attached detachably. The memory device 10 that can be attached to the memory attachment portion 101 might be a stick-like (stick-like) memory device. This stick-like memory device 10 includes a stick-like housing made of a resin material to incorporate therein a nonvolatile memory having a predetermined storage capacity (e.g. capacity which falls within a range of from approximately several M bytes to several 10s of M bytes) in which data can be freely rewritten and a control circuit for managing writing and reading of data in and from the memory and connection terminals. A plurality of kinds of storage capacities are available in this memory device. The memory device 10 includes a stored data miss-erase prevention switch.

Figure 2:
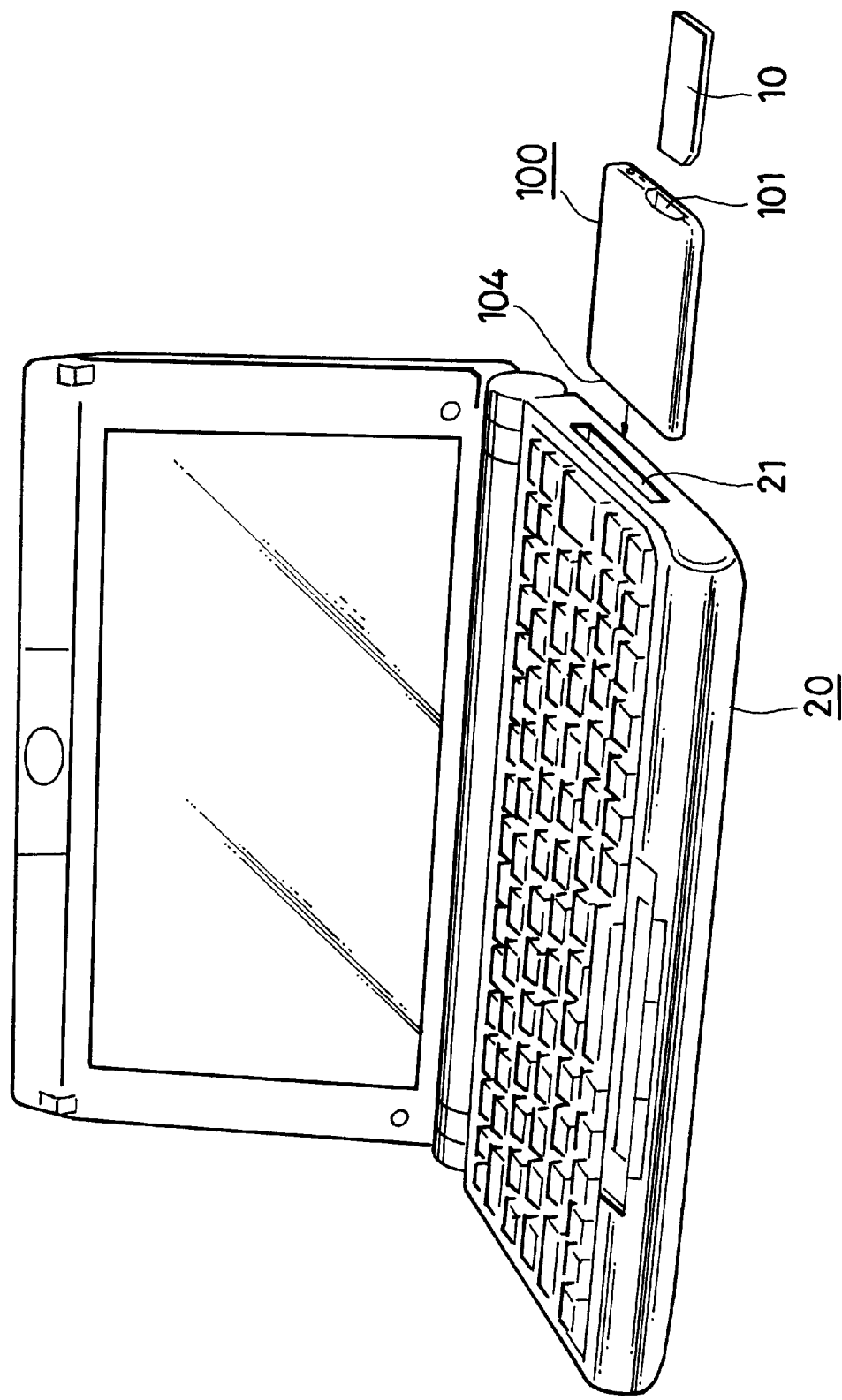
FIG. 2 is a perspective view illustrating an example of the manner in which an audio reproducing card is connected to a personal computer apparatus when audio data is being downloaded according to the first embodiment of the present invention.

FIG. 2 shows an example of the manner in which the audio reproducing card 100 is inserted into a card slot 21 of a personal computer apparatus 20. After the stick-like memory device 10 is being attached to the memory attachment portion 101 of the audio reproducing card 100, the card 100 is inserted into the card slot 21 and the connector portion 104 of the card 100 is connected to the terminal disposed within the card slot 21.

Referring back to FIG. 1, the stick-like memory device 10 attached to the audio reproducing card 100 is connected through a memory interface section 102 within the card to an internal bus 103. The internal bus 103 is also connected to a connector portion 104 of the card 100. When the audio reproducing card is inserted into the card slot of the data processing apparatus, the internal bus 103 is connected through the connector portion 104 to circuits on the data processing apparatus. The connector patt 104 is disposed on the end face of the card 100, for example. When the card is inserted into the card slot, a low direct current voltage at the power supply may be supplied to the connector portion 104 from the external device such as the data processing apparatus.

The audio reproducing card 100 inclds a central processing unit (CPU) 105 for controlling writing and reading of data in and from the memory and audio reproducing operation, a digital signal processor (DSP) 106 for executing data processing such as digital audio data compression and de-compression and an audio unit 107 for executing reproduction processing of audio data. These circuits are respectively connected to the bus 103.

When audio data is transmitted from the outside through the connector portion 104, under control of the central processing unit 105, transmitted data is supplied to the digital signal processor 106. The processor 106 compression-codes the transmitted data to provide compression-coded audio data that can be stored in the memory. Under control of the central processing unit 105, the compression-coded audio data from the digital signal processor 106 is transmitted through the memory interface section 102 to the stick-like memory device 10 and thereby written in the built-in memory of this memory device 10. If audio data supplied from the outside is audio data that had already been compression-coded, then such audio data is not processed by the digital signal processor 106 but is directly transmitted to the memory device 10, in which it is stored. Data other than the audio data may be written in the memory device 10. For example, data accompanied with audio data, such as track numbers and text data such as titles of music and names of players may be written in the memory device at the same time audio data is written in the memory device.

When the audio data stored in the stick-like memory device 10 is read out from the memory device, under control of the central processing unit 105, audio data is transmitted to the digital signal processor 106, and the digital signal processor 106 de-compression-codes the audio data to provide de-compressed digital audio data. The digital audio data, reconverted by the digital signal processor 106, is transmitted to the audio unit 107, in which it is reproduced and an analog audio signal is developed at an output terminal 108. Reproduction processing executed within the audio unit 107 is digital/analog conversion processing for converting digital audio data into an analog audio signal and analog processing for amplifying the converted analog audio signal. The output terminal 108 is a jack into which the plug of the headphone apparatus can be inserted. This output terminal is disposed on the end face of the card 100 on the opposite side of the end face in which the connector portion 104, for example, is disposed.

The system includes a remote controller connection terminal 109 disposed near the position at which the output terminal 108 is located. A remote controller 140, which will be described later on, connected to the terminal 109 can communicate with the central processing unit 105.

The audio reproducing card 100 according to this embodiment is preparing a power-supply unit 120 of substantially the same shape as that of this card 100. When this power-supply unit 120 is connected to the audio reproducing card 100, reproducing electric power is supplied from a battery disposed within the power-supply unit 120 to the audio reproducing card 100. The power-supply unit 120 is shaped with a thickness equal to that of the type II card of the PCMCIA standards. The thickness of two type II cards is equal to that of the type I card. Accordingly, while the power-supply unit 120 is being connected to the audio reproducing card 100, the audio reproducing card can be inserted into the card slot of the type I card of the PCMCIA standards. While the power-supply unit 120 is being connected to the audio reproducing card 100, when the audio reproducing card is inserted into the card slot conforming to the type II card of the PCMCIA standards, the power-supply unit 120 may automatically be disconnected from the audio reproducing card 100 by some suitable mechanism.

The power-supply unit 120 incorporates a thin secondary battery 121 such as a lithium polymer battery and a control unit 122 for controlling charging and discharging of the secondary battery 121. The control unit 122 is connected through a terminal 123 on the power-supply unit 120 and the terminal 110 on the audio reproducing card 100 to the bus 3 and is able to communicate with the central processing unit 105 within the audio reproducing card 100. A charging and discharging terminal 124 of the secondary battery 121 is connected to a power-supply terminal (not shown) on the audio reproducing card 100.

A headphone apparatus 130 is connected to the audio output terminal 108 of the audio reproducing card 100 and includes headphone units 131, 132 which the listener wears on the ears and a remote control section 140 attached to somewhere of a signal line. The remote control section 140 is connected to the remote controller connection terminal 109 and includes operation keys 141, a display driver 142 and a display panel 143. The operation keys 141 are those used to start reproducing audio data, to stop reproducing audio data, to forward audio data and to reverse audio data and those used to increase and decrease of the volume of reproduced sounds.

When the listener operates the operation keys 141 within the remote control section 140, data obtained when the operation keys are operated is supplied to the central processing unit 105 and the central processing unit 105 reproduces audio data as it has been instructed. The central processing unit 105 supplies display data to the display driver 142 to display necessary data such as played music number, play time, title of music and the amount of remaining energy obtainable from the battery.

Figure 3:
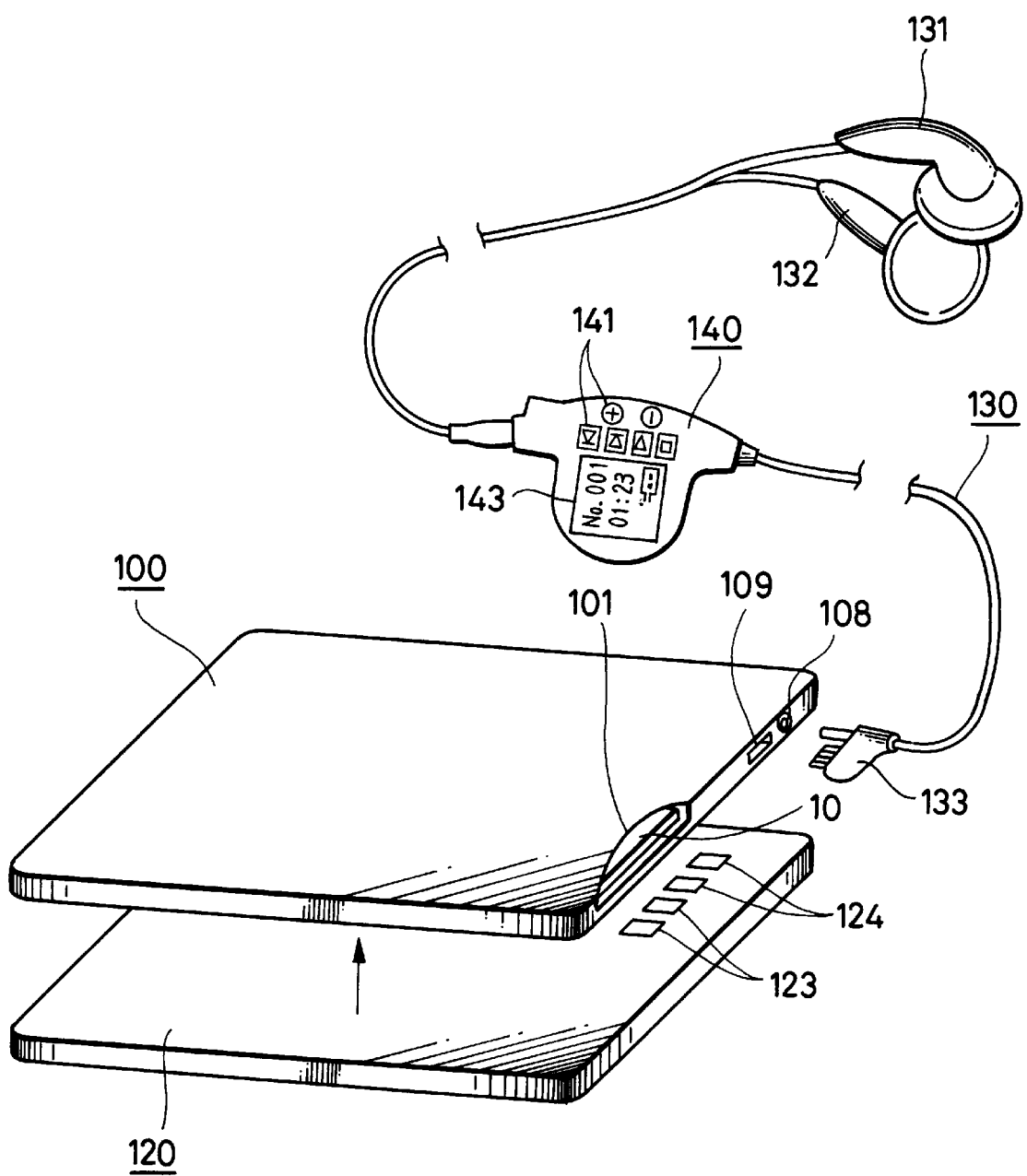
FIG. 3 is a perspective view showing an example of a shape of a reproducing apparatus according to the first embodiment of the present invention.

FIG. 3 shows an example of the manner in which the power-supply unit 120 and the headphone apparatus 130 are connected to the audio reproducing card 100 according to this embodiment and the audio reproducing card is reproducing audio data. A plug 133 of the headphone apparatus 130 is of the type that can simultaneously be connected to both of the audio output terminal 108 and the remote controller connection terminal 109. While the headphone units 131, 132 of the headphone apparatus 130 are illustrated as so-called inner-ear type headphone units directly placed into listener'auricles in the example of FIG. 3, the present invention is not limited thereto, and can be applied to headphone units of other shapes.

Next, an example of the manner in which the listener uses the audio reproducing card 100 will be described. As shown in FIG. 2, while the memory device 100 is being attached to the audio reproducing card 100, this reproducing card 100 is inserted into the card slot 21 of the personal computer apparatus 20. If the card slot 21 is the card slot corresponding to the thickness of the type II card, then the power-supply unit 120 is removed and the audio reproducing card is inserted into the card slot. While the audio reproducing card is being inserted into the card slot 21, electric power required within the card 100 is supplied from the personal computer apparatus 20. If the card slot 21 is the card slot corresponding to the thickness of the type I card, then the power-supply unit 120 remains connected to the audio reproducing card and the audio reproducing card 100 can be inserted into the card slot 21. The secondary battery 121 within the power supply unit 120 can be charged by electric power supplied to the audio reproducing card 100 from the personal computer apparatus 20.

In this state, when the listener operates the personal computer apparatus 20 in a predetermined manner, audio data obtained at the personal computer apparatus 20 is downloaded into the audio reproducing card 100. Programs for protecting a copyright of audio data to be downloaded may be transferred into the audio reproducing card at the same time (or before) audio data is downloaded.

The audio data downloaded into the audio reproducing card 100 is supplied to the digital signal processor 106 under control of the central processing unit 105 and thereby compression-coded. The audio data thus compression-coded is stored in the memory device 10. The audio data compression-coded on the personal computer apparatus 20 may directly be supplied to the audio reproducing card 100.

When the downloaded audio data is reproduced, the headphone apparatus 130 is connected to the audio output terminal 108 as shown in FIG. 3. When the power-supply unit 120 is not attached, the power-supply unit 120 is attached. When the secondary battery 121 within the power-supply unit 120 is not yet charged, the secondary battery can properly be charged by a charging apparatus, not shown, connected thereto.

While the headphone apparatus 130 is being attached to the audio reproducing card 100, when the listener operates the operation keys on the remote control section 140 of the headphone apparatus 130, the central processing unit 105 reads audio data stored in the memory device 10. The audio data thus read out is de-compressed, converted into an analog signal, amplified for reproduction processing, and outputted from the headphone units 131, 132.

With the above arrangement of the audio reproducing card 100, when audio data is downloaded, audio data can easily be downloaded by inserting the audio reproducing card into the card slot of the personal computer apparatus or the like. After audio data had been downloaded, if the listener removes the audio reproducing card 100 from the personal computer apparatus and connects the headphone apparatus and the power-supply unit, then the listener can freely carry and use the music reproducing apparatus as a small audio reproducing apparatus. Since the listener executes necessary playback operation by the remote control section attached to the headphone apparatus, the listener can easily execute the operation. Since the state in which audio data is reproduced is displayed on the remote control section, the listener can easily and visually confirm the state in which audio data is reproduced.

Since the memory device 10 is detachably attached to the audio reproducing card 100 as the storage medium, the listener can easily change a piece of music to be reproduced by chaging the memory device 10. If programs necessary for protecting a copyright of a piece of music to be reproduced is incorporated within the card 100 in advance, then even when the memory device 10 is exchanged, illegal use of a piece of music can properly be prevented. Specifically, if a protecting program for inhibiting audio data that had been downloaded to the memory device 10 by other device from being reproduced is incorporated within the audio reproducing card, then audio data illegally downloaded onto the memory device 10 can automatically be prevented from being reproduced.

Figure 4:
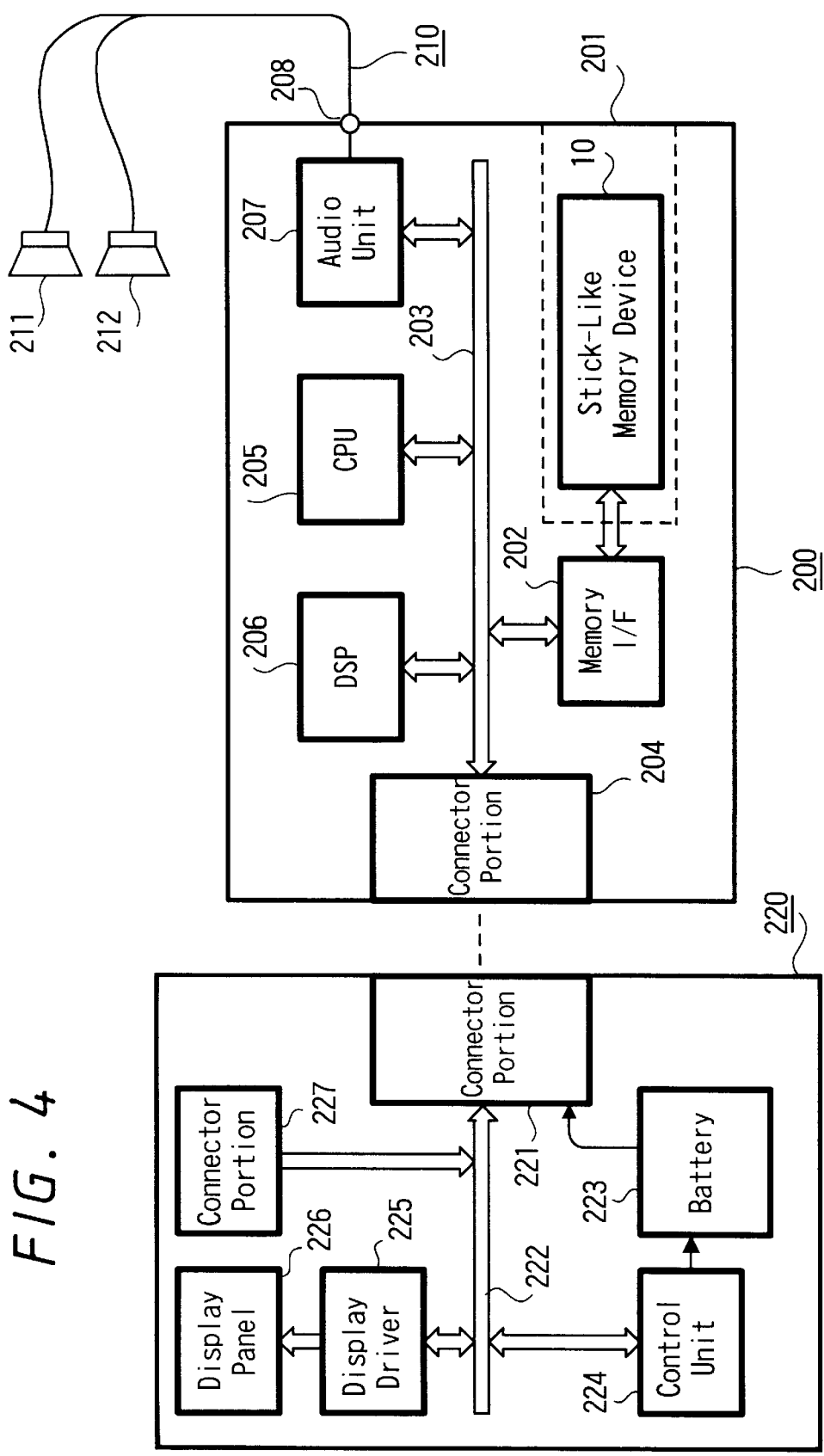
FIG. 4 is a block diagram showing an example of a system configuration according to a second embodiment of the present invention.

Next, a second embodiment according to the present invention will be described with reference to FIGS. 4 and 5. Also in the second embodiment, an audio reproducing card is arranged as a card that can be inserted into a PCMCIA standards card slot similarly to the first embodiment.

A system configuration will be described below with reference to FIG. 4. An audio reproducing card 200 as the PCMCIA standards card includes a memory attachment portion 201 to which there is detachably attached a stick-like memory device 10 having a built-in semiconductor memory. The stick-like memory device 10 attached to the audio reproducing card 200 is connected through a memory interface section 202 to an internal bus 203. The internal bus 203 is also connected to a connector portion 204 of the card 200. Accordingly, when the audio reproducing card 200 is inserted into the card slot of the data processing apparatus, the internal bus 203 is connected through the connector portion 204 to circuits on the data processing apparatus. The connector portion 204 is located on the end face of the card 200, for example. In this embodiment, electric power at a low direct current voltage is supplied from an external device such as the data processing apparatus (when the card slot is installed to the external device) or a power-supply unit 220, which will be described later on, to the connector portion 204 and the audio reproducing card can be operated by electric power at the low direct current voltage.

The audio reproducing card 200 includes a central processing unit (CPU) 205 for controlling writing and reading data in and from a memory and audio reproducing operation, a digital signal processor (DSP) 206 for executing data processing such as digital audio data compression and de-compression and an audio unit 207 for executing reproduction of audio data. These circuits are respectively connected to the bus 203.

When audio data is transmitted from the outside through the connector portion 204, under control of the central processing unit 205, data to be transmitted is supplied to the digital signal processor 206 and the processor 206 converts the transmitted audio data to compression-coded audio data for storage. Under control of the central processing unit 205, the audio data compression-coded by the digital signal processor 206 is transmitted through the memory interface section 202 to the stick-like memory device 10 and written in the built-in memory of the memory device 10. If the audio data supplied from the outside is audio data that had already been compression-coded, then such audio data is not processed by the digital signal processor 206 but is directly transmitted to the memory device 10. Data other than the audio data may be written in the memory device 10 to be stored. For example, data accompanied with audio data such as track numbers and text data such as titles of music and names of players may be written in the memory device at the same time audio data is written in the memory device.

When the audio data stored in the stick-like memory device 10 is read out from the memory, under control of the central processing unit 205, the audio data is transmitted to the digital signal processor 206 and the processor 206 de-compresses the digital audio data to provide digital audio data which is not compressed in code. The digital audio data reconverted by the digital signal processor 206 is transmitted to the audio unit 207, in which it is reproduced and outputted at the output terminal 208 as an analog audio signal. The reproduction processing within the audio unit 207 is digital/analog conversion for converting digital audio data into an analog audio signal and analog processing for amplifying the converted analog audio signal. The output terminal 208 is a jack into which a plug of a headphone apparatus can be inserted. This output terminal is disposed on the end face of the card 200 at its opposite side of the end face in which the connector portion 204, for example, is located.

A plug of a headphone apparatus 210 is connected to the output terminal 208. In this embodiment, the headphone apparatus 210 might be a headphone apparatus with only the headphone units 211, 212 connected thereto (i.e., headphone apparatus without remote control section like the first embodiment).

With the arrangement of the audio reproducing card 200 according to this embodiment, the power-supply unit 220 can be connected to the connector portion 204 of the card 200. Specifically, the connector portion 204 is the terminal portion which is being connected to the terminal disposed within the slot when the card 200 is inserted into the card slot. While the card is being removed from the card slot, the power-supply unit 220 separate from the card 200 can be connected to the connector portion 204.

Figure 5:
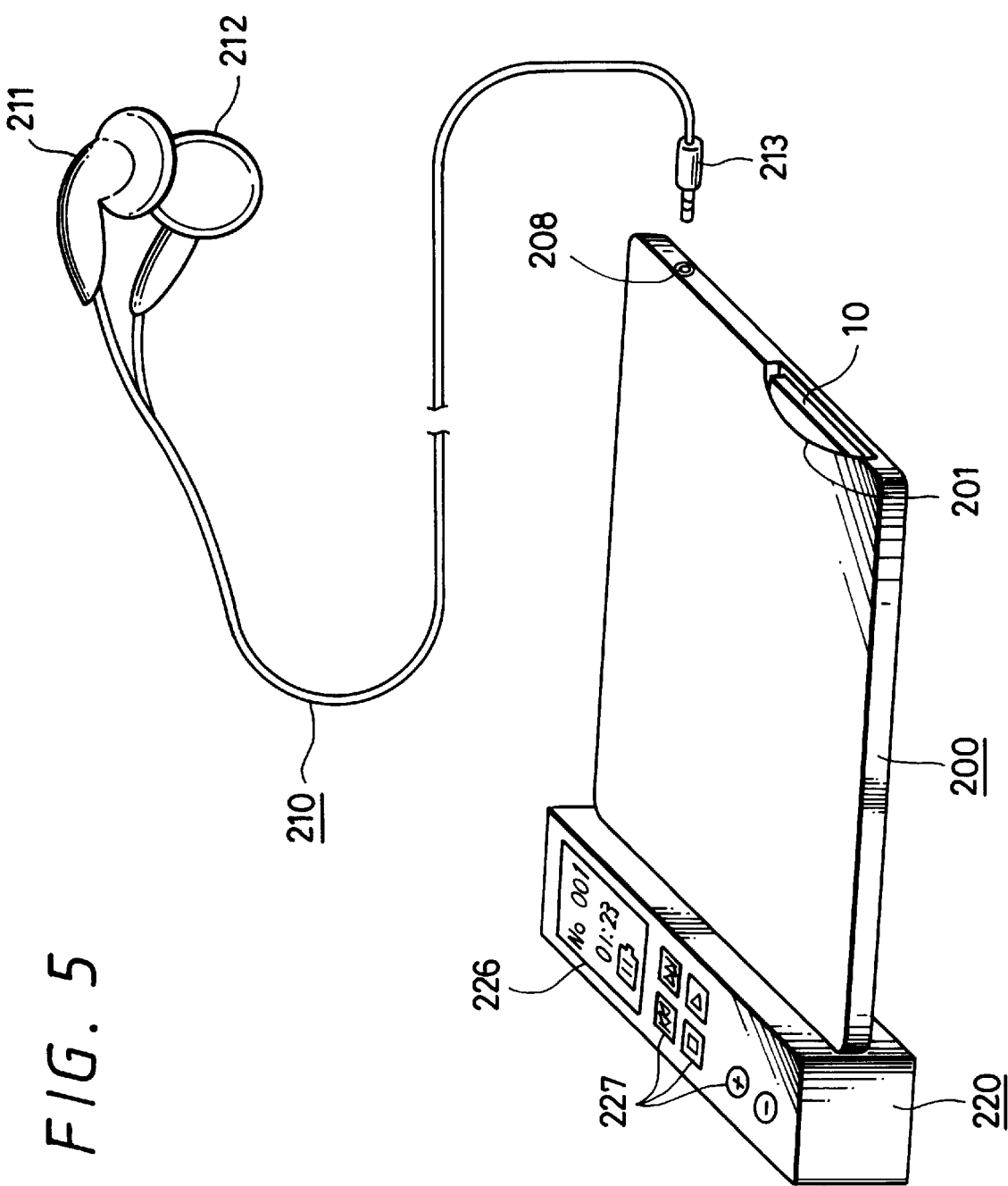
FIG. 5 is a perspective view showing an example of a shape of a reproducing apparatus according to the second embodiment of the present invention.

FIG. 5 shows the manner in which the power-supply unit 220 is connected to the audio reproducing card. The power-supply unit 220 is thicker than the card 200 and can house therein a relatively large battery.

Referring back to FIG. 4, the power-supply unit 220 includes a connector portion 221 connected to the connector portion 204 on the card side and the audio reproducing card can be powered by a battery 223 housed within the power-supply unit 220 through the connector portion 221. The battery 223 is not limited to a secondary battery such as a lithium ion battery and a nickel hydrogen battery, and a primary battery can be attached to the power-supply unit.

The power-supply unit 220 includes a bus 222 connected to the connector portion 221 to enable the control unit 224 of the battery 223 to communicate with the central processing unit 205 on the card 200. Accordingly, the central processing unit 205 can judge the amount of remaining energy obtainable from the battery. The power-supply unit 220 includes a display panel 226 the display of which is energized by a display driver 225. The display panel is able to display the state in which audio data is reproduced under control of the central processing unit 205. The power-supply unit 220 further includes operation keys 227. While the listener is operating the operation keys 227 to reproduce audio data, data obtained when the listener operates the operation keys is supplied to the central processing unit 205.

With the above arrangement of the audio reproducing card 200, similarly to the audio reproducing card 100 according to the first embodiment, when audio data is downloaded, audio data can easily be downloaded only by inserting the audio reproducing card into the card slot of the personal computer apparatus or the like. After audio data had been downloaded, the listener removes the audio reproducing card 200 from the card slot and becomes able to freely carry and use the audio reproducing card as a small audio reproducing apparatus by connecting the headphone apparatus and the power-supply unit. The listener can reproduce audio data by operating the operation keys 227 on the power-supply unit 220. The state in which audio data is being reproduced is displayed on the display panel 226 on the power-supply unit 220 and hence the listener can easily confirm the state in which audio data is reproduced. Similarly to the first embodiment, since the memory device 10 is detachably attached to the audio reproducing card 200 as the storage medium, the listener can easily change a piece of music to be reproduced by exchanging the memory device 10.

According to the second embodiment, since the power-supply unit 220 is not the card-type power-supply unit, the battery housed within the power-supply unit 220 is not limited to thin batteries and various types of batteries can be used.

Figure 6:
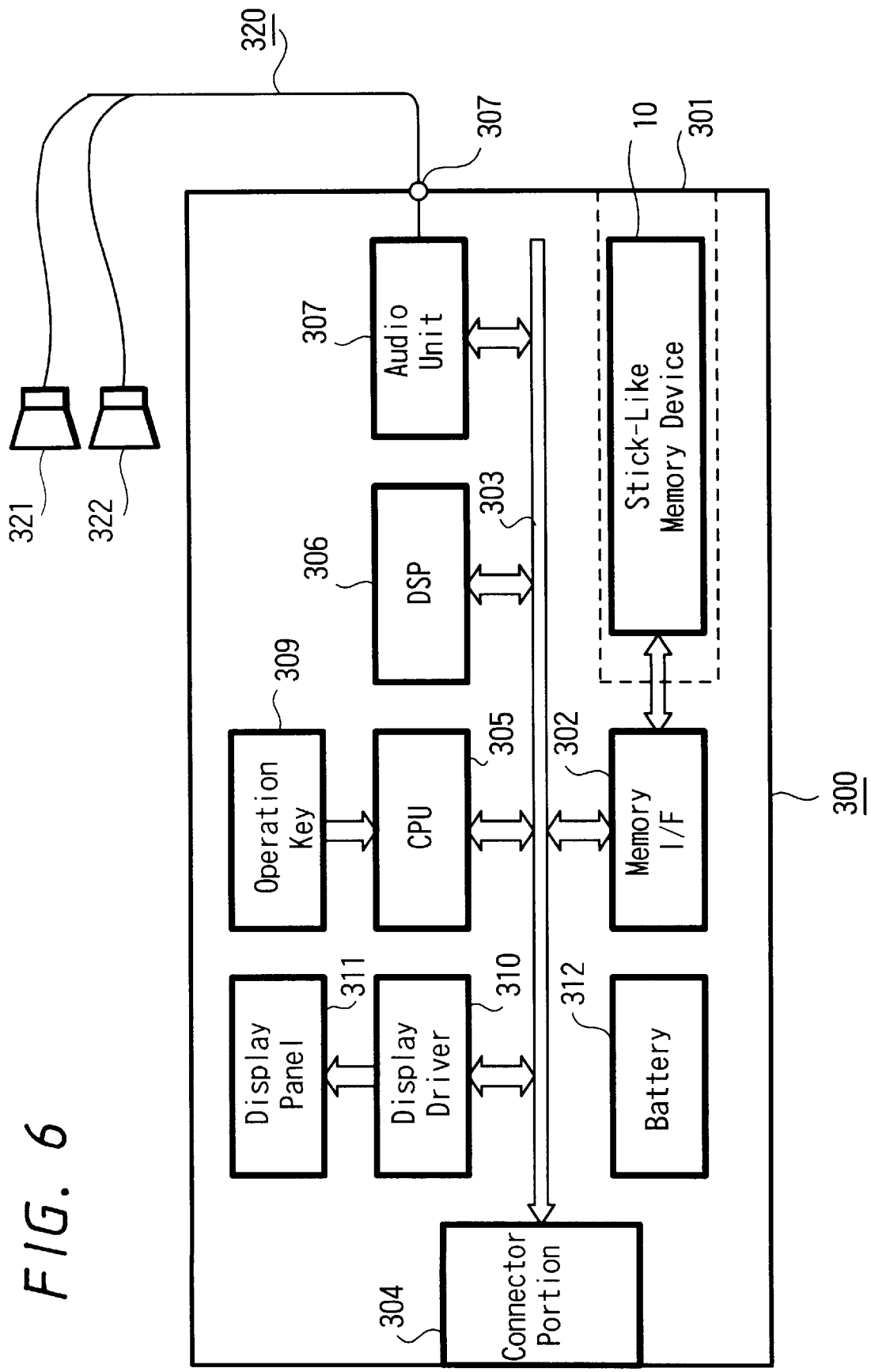
FIG. 6 is a block diagram showing an example of a system configuration according to a third embodiment of the present invention.

Next, a third embodiment of the present invention will be described with reference to FIGS. 6 and 7. Also in the third embodiment, an audio reproducing card is arranged as a card that can be inserted into the PCMCIA standards card slot similarly to the first and second embodiments.

A system configuration will be described below with reference to FIG. 6. An audio reproducing card 300 arranged as a PCMCIA standards card includes a memory attachment portion 301 to which the stick-like memory device 10 including a built-in semiconductor memory can detachably be attached. The stick-like memory device 10 attached to the audio reproducing card 300 is connected through a memory interface section 302 to an internal bus 303. The internal bus 303 is also connected to a connection portion 304 of the card 300. Accordingly, when the audio reproducing card 300 is inserted into a card slot of a data processing apparatus, the internal bus 303 is connected through the connector portion 304 to circuits on the data processing apparatus. The connector portion 304 is disposed on the end face of the card 300, for example. In this embodiment, a battery (secondary battery or small primary battery such as a button-type battery) 312 is housed within the card 300 and the card can be operated by electric power from the battery 312.

The audio reproducing card 300 includes a central processing unit (CPU) 305 for controlling writing and reading of data in and from a memory and audio data reproduction operation, a digital signal processor (DSP) 306 for executing data processing such as compression of digital audio data and de-compression of digital audio data, an audio unit 307 for executing reproduction processing of audio data and a display driver 310 for driving a display panel 311. These circuits are connected to the bus 303 respectively. The display panel 311 is disposed on the surface of the card, for example. Operation keys 309 are disposed on the surface of the card. When operation keys are operated, data obtained when operation keys are operated is directly supplied to the central processing unit 305.

When audio data is transmitted through the connector portion 304 from the outside, under control of the central processing unit 305, data to be transmitted is supplied to the digital signal processor 306 and the processor processes the transmitted data to provide compression-coded audio data for storage. The audio data that had been compression-coded by the digital signal processor 306 is transmitted through the memory interface section 302 to the stick-like memory device 10 under control of the central processing unit 305 and stored in the built-in memory of the memory device 10. If audio data supplied from the outside is audio data that had already been compression-coded, then such audio data is not processed by the digital signal processor 306 but is directly transmitted to and stored in the memory device 10. Data other than the audio data may be written in the memory device 10. For example, data being accompanied with the audio data such as track number and text data such as titles of music and names of players may be written in the memory device at the same time the audio data is written.

When the audio data stored in the stick-like memory device 10 in this manner is read out from the memory device, under control of the central processing unit 305, audio data is transmitted to the digital signal processor 306 and the processor 306 de-compresses the audio data to provide digital audio data which is not compressed. The digital audio data reconverted by the digital signal processor 306 is transmitted to the audio unit 307, in which it is reproduced and outputted at the output terminal 308 as an analog audio signal. Reproduction processing within the audio unit 307 is digital/analog conversion processing for converting digital audio data into an analog audio signal and analog processing for amplifying the converted analog audio signal. The output terminal 308 is arranged as a jack into which a plug of a headphone apparatus can be inserted and is located on the end face of the card 300 on the opposite side of the end face in which the connector portion 304, for example, is located.

A plug of a headphone apparatus 320 is connected to the output terminal 308. In this embodiment, the headphone apparatus 320 might be a headphone apparatus with only the headphone units 321, 322 connected thereto (i.e., headphone apparatus without remote control section like the first embodiment).

Figure 7:
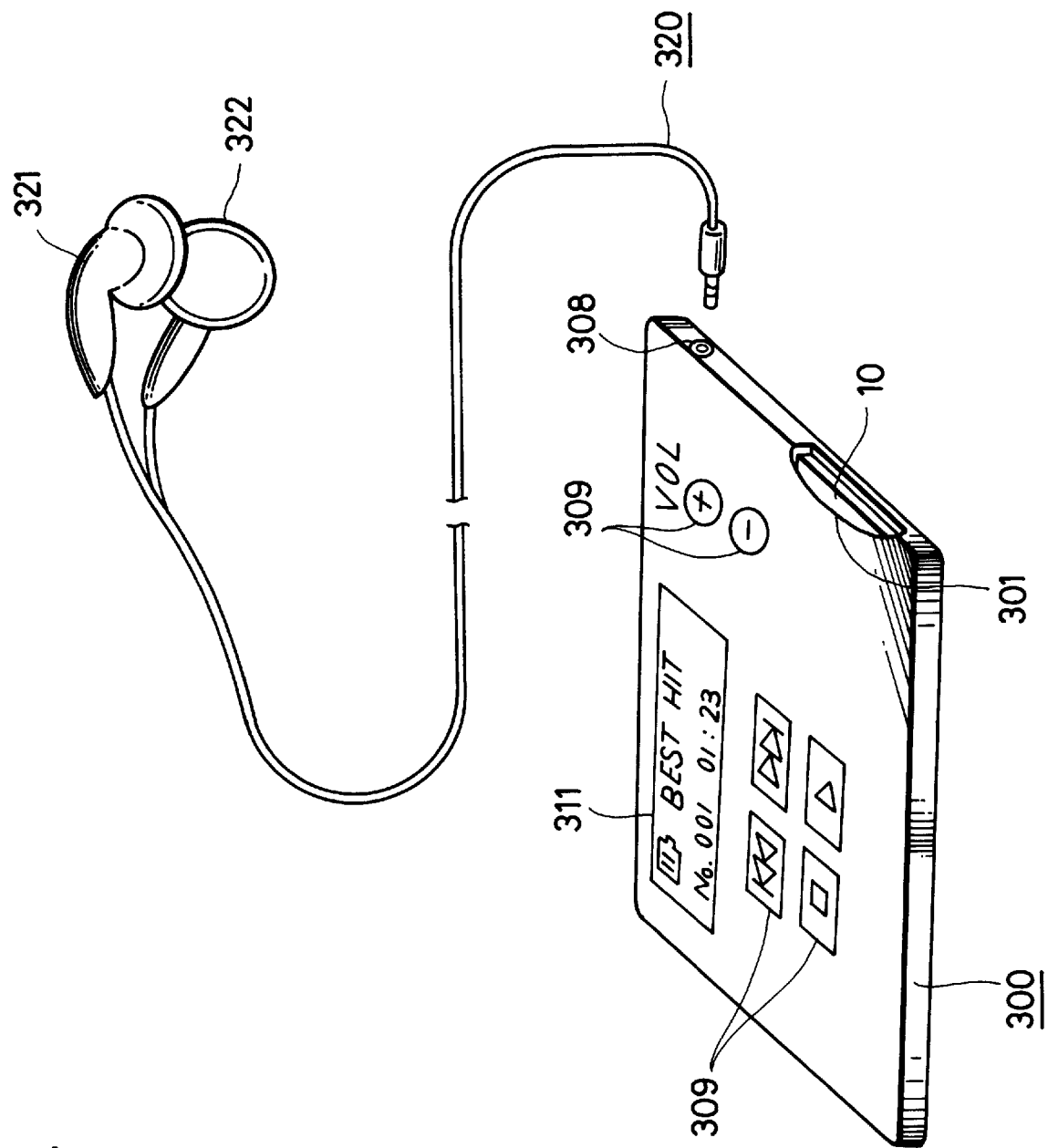
FIG. 7 is a perspective view showing an example of a shape of a reproducing apparatus according to the third embodiment of the present invention.

FIG. 7 shows an example of the manner in which the headphone apparatus 320 is connected to the audio reproducing card 300. In this example, various operation keys 309 and the display panel 311 are located on the surface of the audio reproducing card 300. While the headphone apparatus 320 is being connected to the audio reproducing card 300, the listener can reproduce a piece of music only by operating operation keys disposed on the surface of the card 300.

With the above arrangement of the audio reproducing card 300, similarly to the audio reproducing card 100 according to the first embodiment, when audio data is downloaded, the listener can easily download audio data only by inserting the audio reproducing card into the card slot of the personal computer apparatus. After audio data had been downloaded, when the listener removes the audio reproducing card 300 from the card slot and connects the headphone apparatus to the audio reproducing card, the listener can freely carry and use the audio reproducing card as a small audio reproducing apparatus. The listener can reproduce audio data by operating the operation keys 309 directly disposed on the audio reproducing card 300. Since the state in which audio data is reproduced is displayed on the display panel 311 located on the card 300, the listener can easily and visually confirm the state in which audio data is reproduced. Similarly to the first embodiment, since the memory device 10 is detachably attached to the audio reproducing card 300 as the storage medium, the listener can easily change a piece of music to be reproduced by exchanging the memory device 10.

Figure 8:
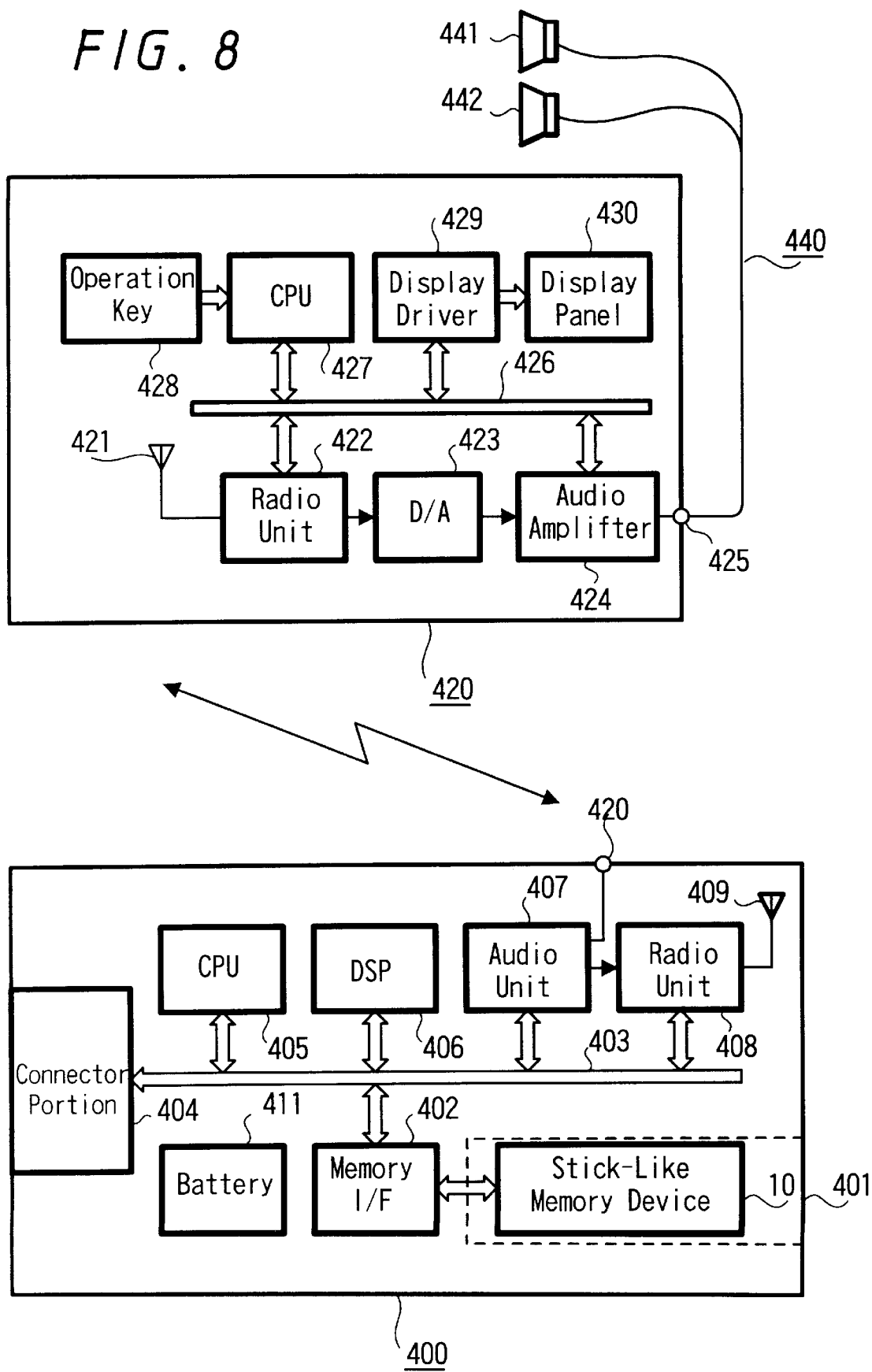
FIG. 8 is a block diagram showing an example of a system configuration according to the fourth embodiment of the present invention.

Next, a fourth embodiment according to the present invention will be described with reference to FIG. 8. Also in the fourth embodiment, an audio reproducing card is arranged as a card that can be inserted into the PCMCIA standards card slot similarly to the first, second and third embodiments.

A system configuration will be described below with reference to FIG. 8. An audio reproducing card 400 arranged as the PCMCIA standards card includes a memory attachment portion 401 to which the stick-like memory device 10 having the built-in semiconductor memory can be attached detachably. The stick-like memory device 10 attached to the audio reproducing card 400 is connected through a memory interface section 402 to an internal bus 403. This internal bus 403 is also connected to a connector portion 404 of the card 400. When the card is inserted into a card slot of a data processing apparatus, the internal bus is connected through the connector portion 404 to circuits on the data processing apparatus. The connector portion 404 is disposed on the end face of the card 400, for example. In this embodiment, a battery (secondary battery or small primary battery such as a button battery) 411 is housed within the card 400 and the card can be operated by electric power from the battery 411.

The audio reproducing card 400 includes a central processing unit (CPU) 405 for controlling writing and reading data in and from the memory and audio data reproduction, a digital signal processor (DSP) 406 for executing data processing such as digital audio data compression processing and de-compression processing, an audio unit 407 for executing reproduction processing of audio data and a radio unit 408 for transmitting audio data or the like via radio waves and receiving control data by radio waves. These circuits are connected to the bus 403 respectively. An audio output terminal 410 also is connected to the audio unit 407 and the headphone apparatus can directly be connected to the audio output terminal.

The radio unit 408 includes an antenna 409 connected thereto to transmit audio data at a predetermined frequency via radio waves and can receive control data when the control data for instructing reproduction or the like is transmitted via radio waves. The antenna 409 is not limited to the built-in antenna of the card 400 but may be projected to the outside of the card 400.

When audio data is transmitted from the outside through the connector portion 404, under control of the central processing unit 405, data to be transmitted is supplied to the digital signal processor 406 and the processor 406 processes the data to provide compression-coded audio data for storage. Under control of the central processing unit 405, the audio data compression-coded by the digital signal processor 406 is transmitted through the memory interface section 402 to the stick-like memory device 10 and written in the built-in memory of the memory device 10. If the audio data supplied from the outside is audio data that had already been compression-coded, then such audio data is not processed by the digital signal processor 406 and may be directly transmitted to and stored in the memory device 10. Data other than the audio data can be written in the memory device 10. For example, data being accompanied with the audio data, such as track number and text data such as titles of music and names of players can be written in the memory device at the same time audio data is written.

When the audio data stored in the stick-like memory device 10 in this manner is read out from the memory device, under control of the central processing unit 405, audio data is transmitted to the digital signal processor 406 and the processor 406 de-compresses the audio data to provide de-compressed digital audio data. The digital audio data reconverted by the digital signal processor 406 is transmitted to the audio unit 407, in which it is reproduced. The audio data thus reproduced is transmitted from an antenna 409 connected to a radio unit 408 via radio waves.

The audio data transmitted through radio waves is received at a receiving unit 420. The receiving unit 420 includes a radio unit 422 with an antenna 421 connected thereto, a digital/analog converter 423 for converting the audio data received at the radio unit 422 into an analog audio signal and an audio amplifier 424 for amplifying the audio signal converted by the converter 423 and supplies an audio signal amplified by the audio amplifier 424 to headphone units 441, 442 of a headphone apparatus 440 connected to an audio output terminal 425.

The receiving unit 420 incorporates therein a central processing unit (CPU) 427 for controlling operation within the receiving unit 420, operation keys 428 and a display panel 430 whose display is driven by a display driver 429. These elements are connected by an internal bus 426.

When text data such as titles of music and data such as reproduced tracks and reproducing time are transmitted together with audio data via radio waves, these data can be displayed on the display panel 430. Data obtained when the operation keys 428 were operated is supplied from the central processing unit 427 to the radio unit 422 and transmitted from the antenna 421 via radio waves, whereby control data for instructing reproduction can be transmitted to the audio reproducing card 400 via radio waves. The receiving unit 420 also incorporates therein a suitable means such as a battery.

With the above arrangement of the audio reproducing card 400 and the receiving unit 420, similarly to the audio reproducing card 100 according to the first embodiment, when audio data is downloaded, the listener can easily download audio data only by inserting the audio reproducing card 400 into a card slot of a personal computer apparatus or the like. After the audio data had been downloaded, the listener removes the audio reproducing card 400 from the card slot and can freely carry and use the audio reproducing card as a small audio reproducing apparatus. In this case, the audio reproducing card 400 and the receiving unit 420 are connected in a wireless fashion and hence freedom in the reproduction can increase much more as compared with the first, second and third embodiments. Since the memory device 10 is detachably attached to the audio reproducing card 300 as the storage medium similarly to the first embodiment, the listener can easily change a piece of music to be reproduced by exchanging the memory device 10.

While the stick-like memory device is used as the memory device that can be detachably attached to the reproducing apparatus in the above embodiments, memory devices of other shapes may be used. The memory device may not be limited to the detachable memory device and a semiconductor memory having a predetermined storage capacity may be incorporated within a card-type reproducing apparatus.

While the music reproducing apparatus is arranged as the PCMCIA standards card-type reproducing apparatus in the above embodiments, the present invention is not limited thereto, and it is needless to say that the music reproducing apparatus may be arranged as card-type reproducing apparatus corresponding to other card slot standards.

The card-type reproducing apparatus may be powered by other arrangement than the power-supply arrangement described in the above embodiments. For example, a battery compartment may be provided within the remote control section 140 according to the first embodiment and the card 100 may be powered by a battery disposed within the remote control section 140.

While the audio data inputted from the data processing apparatus to which the card-type reproducing apparatus is attached is stored in the memory in the above embodiments, the present invention is not limited thereto, and the audio reproducing card, for example, may include an audio input terminal separate from (or serving also as) the audio output terminal to store an audio signal picked up by a microphone connected to this input terminal in the memory. Thus, the audio reproducing card may function as a recording and reproducing apparatus.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A data reproducing apparatus comprising:

connecting means connectable to a data processing apparatus when it is connected to a predetermined card slot of said data processing apparatus;

storage means for storing data obtained from said data processing apparatus through said connecting means;

storage connecting means for detachably connecting said storage means to said data reproducing apparatus;

data reproducing means for reproducing data from said storage means;

output means for outputting data reproduced by said data reproducing means;

control means for controlling operation of said data reproducing means; and a card-like housing for integrally housing therein said connecting means, said storage means, storage connecting means, said data reproducing means, said output means and said control means.

2. The data reproducing apparatus according to claim 1, wherein said data is audio data.

3. The data reproducing apparatus according to claim 2, wherein said storage means is detachable from said card-like housing.

4. The data reproducing apparatus according to claim 2, further comprising:

a headphone apparatus connected to said output means for enabling a user to listen to audio data outputted from said output means; and operating means connected to said control means for instructing operation of said data reproducing apparatus, wherein said control means controls operation of said data reproducing means in such a manner that said data reproducing means is operated in response to an operating instruction issued from said operating means.

5. The data reproducing apparatus according to claim 4, wherein said operating apparatus further includes display means for displaying a state in which said data reproducing means is reproducing data.

6. The data reproducing apparatus according to claim 2, further comprising a power-supply apparatus connectable to said card-like housing which includes power-supply means for energizing respective means provided within said card-like housing.

7. The data reproducing apparatus according to claim 5, further comprising a power-supply apparatus connectable to said card-like housing which includes power-supply means for energizing respective means provided within said card-like housing.

8. The data reproducing apparatus according to claim 2, wherein said card-like housing further houses therein operating means connected to said control means and which instructs operation of said data reproducing means and display means for displaying a state in which said data reproducing means is reproducing data.

9. A data reproducing apparatus comprising:

a first card-like housing integrally housing therein connecting means connectable to a data processing apparatus when it is connected to a predetermined card slot of said data processing apparatus, storage means for storing therein data obtained from said data processing apparatus through said connecting means, storage connecting means for detachably connecting said storage means to said data reproducing apparatus, data reproducing means for reproducing data from said storage means, first communication means for transmitting data reproduced by said reproducing means and receiving instruction contents instructed by operating means and control means for controlling operation of said data reproducing means; and a second housing for integrally housing therein said operating means for instructing operation of said data reproducing means, second communication means for transmitting said instruction contents instructed by said operating means to said control means and receiving data transmitted from said first communication means and output means for outputting data received by said second communication means.

10. The data reproducing apparatus according to claim 9, wherein said second housing further houses therein display means for displaying a state in which said data reproducing means is reproducing data.

* * * * *